United States Patent [19]

Parks

[11] Patent Number: 4,999,632
[45] Date of Patent: Mar. 12, 1991

[54] ANALOG TO DIGITAL CONVERSION WITH NOISE REDUCTION

[75] Inventor: Robert A. Parks, Springport, Ind.

[73] Assignee: Boehringer Mannheim Corporation, Indianapolis, Ind.

[21] Appl. No.: 451,212

[22] Filed: Dec. 15, 1989

[51] Int. Cl.$^5$ ............................................. H03M 1/52
[52] U.S. Cl. ...................................... 341/167; 341/166
[58] Field of Search ............................. 341/166, 167

[56] References Cited

U.S. PATENT DOCUMENTS

| | | | |
|---|---|---|---|
| 3,696,403 | 10/1972 | DiRocco | 341/167 |
| 3,701,146 | 10/1972 | Haga et al. | 341/167 |
| 3,729,733 | 4/1973 | Dorey | 341/167 |
| 4,633,221 | 12/1986 | Bradshaw et al. | 341/167 |
| 4,656,459 | 4/1987 | Thurber, Jr. | 341/167 |
| 4,908,623 | 3/1990 | Ullestad | 341/167 |

Primary Examiner—A. D. Pellinen
Assistant Examiner—Marc S. Hoff
Attorney, Agent, or Firm—Perman & Green

[57] ABSTRACT

An analog-to-digital converter employs a capacitor circuit for integrating a sample of an input signal during a predetermined interval of time and, thereafter, the capacitor is discharged at a predetermined rate until the integration voltage is equal to that of a reference. The discharge time serves as a measure of the amplitude of the input signal. A measurement interval is established which is equal to an integral number of cycles of each of the possible values of frequency of the A.C. excitation. The signal integration interval has a duration less than or approximately equal to the shortest period of the A.C. excitation, this being the period of the highest frequency A.C. excitation. The signal integration is repeated periodically at each third half-cycle of the highest frequency excitation so that the total integration time experienced during positive half cycles is equal to that experienced during negative half cycles of any of the plurality of excitation frequencies. This cancels the effect of noise due to signal polarity.

2 Claims, 2 Drawing Sheets

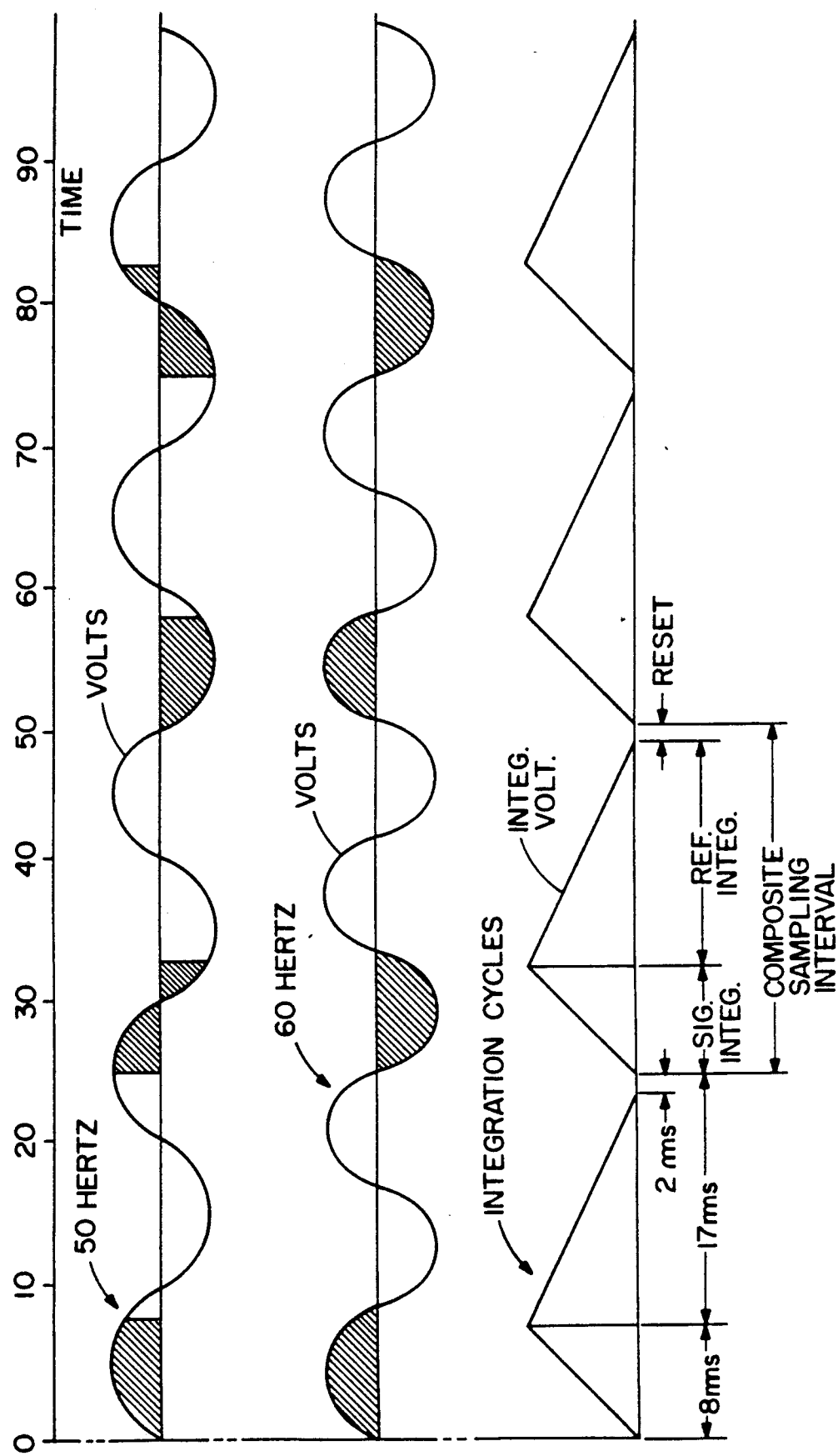

ANALOG TO DIGITAL CONVERSION WITH NOISE REDUCTION

REFERENCE TO RELATED APPLICATIONS

This invention is related to inventions described in:

U.S. patent application Ser. No. 07/451,107, filed 15 December, entitled "Regulated Bifurcated Power Supply" by Parks and White.

U.S. patent application Ser. No. 07/451,108, filed 15 December, entitled "Biosensor Electrode Excitation Circuit" by Parks and White.

U.S. patent application Ser. No. 07/451,309, filed 15 December, entitled "Biosensing Instrument And Method" by White.

BACKGROUND OF THE INVENTION

This invention relates to circuits for the conversion of analog signals to digital signals, which circuits are powered with D.C. (direct current) voltages derived from power supplies energized with A.C. (alternating current) voltage such as 50 or 60 Hertz voltage and, more particularly, to the construction of such a circuit with dual slope integration over a time interval commensurate to the periods of the two A.C. voltages to reduce the effect of noise on output signals of the converter circuit from the A.C. voltages.

Analog-to-digital converters are employed frequently in the measurement of signals, such as those of biological experiments, by way of example, to convert analog values of measured signals to digitally formatted signals suitable for processing by a digital computer. Many forms of these circuits are known. It is common practice in the construction of these circuits to employ D.C. voltages to operate components of the circuits, such as transistors and integrated circuits from which these circuits are constructed. Ideally, the digital converter should be powered by a battery so as to avoid 50 or 60 Hertz hum, or similar noise which enters into power supplies which employ A.C. voltage as the primary source of power. However, in many situations it is necessary to employ A.C. power as the primary source of power to be converted to a regulated D.C. power which is then applied to operate the analog-to-digital converter. As a result, during measurements of high precision, such as may be employed in biological testing, the desired precision is reduced due to noise influence from the A.C. power.

SUMMARY OF THE INVENTION

The foregoing problem is overcome and other advantages are provided by an analog-to-digital converter which, in accordance with the invention, employs dual slope integration and timing circuitry for operating each integration periodically over a measurement interval commensurate with the periods of the A.C. excitation which powers the converter. The periodicity of the integration intervals is selected so that certain circuit integration intervals occur during positive half cycles of the A.C. excitation while other integration intervals occur during negative half cycles of the A.C. excitation. The amount of integration time occurring during a totality of positive half cycles is equal to the amount of integration time occurring during a totality of negative half cycles so that any influences of noise associated with positive polarity of a positive half cycle is cancelled essentially by noise associated with negative polarity of a negative half cycle.

The invention is readily demonstrated by use of a converter which is to be powered by either 60 Hertz excitation or 50 Hertz excitation. Herein, there is a common measurement interval of 6 periods of the A.C. excitation at 60 Hertz, this measurement interval being equal to 5 periods of A.C. excitation at the 50 Hertz. Therefore, by developing a sequence of integrations of the input signal, which integrations repeat periodically over the measurement interval, it is possible to have an equal number of the integrations occur during positive and negative half cycles of the A.C. excitation.

With respect to the integration, the dual slope integration provides for paired integrations, preferably by a capacitor, wherein a first integration of each pair is obtained during a sampling interval of the signal being measured, and the second integration provides for a reduction in stored charge, or discharge of the capacitor, through a predetermined resistive path. This allows the value of the integrated signal to be compared to a reference by a comparator. Thereafter, there is a dead time preparatory to initiation of the next signal sample integration. The signal sample integration is of a fixed predetermined duration so that the voltage produced by the integrating element, a capacitor in the preferred embodiment of the invention, is a measure of signal amplitude.

The capacitor discharge of the ensuing integration, which may be referred to as the reference integration, has a varying duration depending on the amount of charge which must be discharged from the capacitor to reduce the value of integrated voltage to a value equal to that of the reference. Therefore, the length of the reference integration time is a measure of the input signal amplitude. A timing circuit, such as a counter driven by clock pulses, is employed to measure the duration of the reference integration and thereby establish a numerical value of the amplitude of the signal being measured.

As an example in the use of the invention with 50 Hertz and 60 Hertz excitation, the signal integration is accomplished over a predetermined interval of time which is set approximately equal to, or less than one half of the shortest period of the A.C. excitation to allow adequate time for discharging the capacitor and resetting the integrator. The shortest period occurs with the 60 Hertz excitation. Accordingly, the signal integration time is set to a value less than or approximately equal to 8.33 milliseconds. Furthermore, in accordance with the arrangement of the sequence of integrations, the signal integration is to be repeated at every third half-cycle of the higher frequency excitation, this being every third half-cycle of the 60 Hertz excitation. This allows for an elapsed time of a full cycle of the 60 Hertz excitation to accomplish the reference integration and a dead time for resetting the integrator.

Upon comparing these integration intervals with the elapsed time in half-cycles of the lower frequency excitation, namely the 50 Hertz excitation, it is noted that in the foregoing example, the signal integration time is shorter than a half-cycle of the 50 Hertz excitation. The invention is operative with longer signal integration times if desired, but the foregoing temporal relationship is employed in a preferred embodiment of the invention. Upon a superposition of the signal integration intervals upon the 50 Hertz wave form during the measurement interval, it is observed that there is a total of four signal integrations during the measurement interval with the first signal integration occurring during a first half cycle of the 50 Hertz excitation, a second signal integration interval occurring partly in a third and partly in a fourth half-cycle of the 50 Hertz excitation, a third signal integration occurring during a sixth half-cycle of the 50 Hertz excitation, and a fourth signal integration occurring partly in the eighth and partly in the ninth half-cycle of the 50 Hertz excitation. There is a total of ten half-cycles of the 50 Hertz excitation and a total of 12 half-cycles of the 60 Hertz excitation occurring during one measurement interval. With either excitation, the total of the signal duration times in all of the positive half cycles is equal to the total signal integration times in all of the negative half cycles. Therefore, for either excitation frequency, full cancellation of noise associated with signal polarity is obtained by the invention. It is noted such cancellation can be provided in a single cycle but with a much longer overall conversion cycle.

BRIEF DESCRIPTION OF THE DRAWINGS

The foregoing aspects and other features of the invention are explained in the following description, taken in connection with the accompanying drawing wherein:

FIG. 3 is a timing diagram showing waveforms of A.C. excitation for components of the converter and registration with a sequence of sampling intervals of the converter.

DETAILED DESCRIPTION

Figure 1:
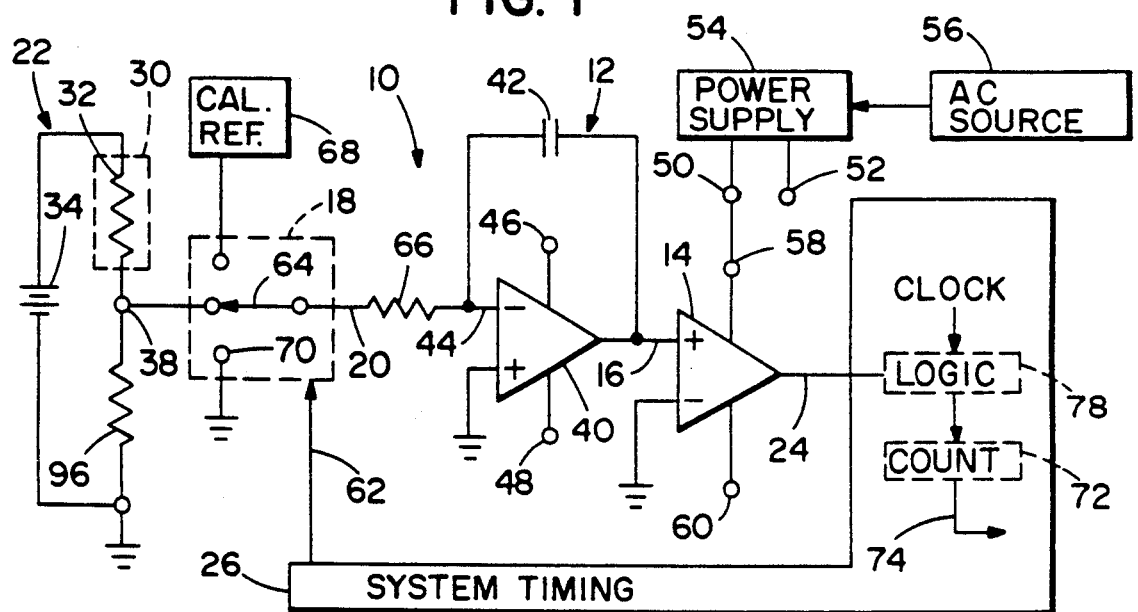
FIG. 1 is a schematic diagram of the analog-to-digital converter of the invention including connections with system timing and a microprocessor.

FIG. 1 shows a schematic drawing of a converter 10 of analog voltage to digital count. In accordance with the invention, the converter 10 comprises an integrator 12, a comparator 14 connected to an output terminal of the integrator 12 at line 16, and a switch 18 which connects an input terminal of the integrator 12 at line 20 to a source 22 of input signal. An output terminal of the comparator 14, at line 24, connects with a system timing unit 26. The timing unit 26 is operative with a microprocessor 28 coupled thereto.

By way of example in the use of the converter 10, the input signal source 22 is shown as test equipment for biological testing. A biological sample 30, indicated in phantom, has internal resistance represented by a resistor 32 through which an electric current can be impressed by a battery 34. In the source 22, the battery 34 is connected serially with the resistor 32 by a current measuring resistor 36 having much smaller resistance than the resistance of the resistor 32 so as to have no more than insignificant effect on the magnitude of current flowing through the resistor 32. A voltage drop across the resistor 36 between terminal 38 and ground serves as a measure of the current flowing through the biological sample 30, and also serves as the input signal to the converter 10.

In accordance with a feature of the invention, the integrator 12 comprises an operational amplifier 40 with a capacitor 42 connected in a feedback path between an output terminal of the amplifier 40, at line 16, and an inverting input terminal 44 of the amplifier 40. The electric power for operation of the amplifier 40 is provided by a pair of terminals 46 and 48 which connect with terminals 50 and 52, respectively, of a D.C. power supply 54. The power supply 54, in turn, is energized with alternating current and voltage from an A.C. power source 56. By way of example, the power supply 54 may be a regulated power supply which converts A.C. voltage to D.C. voltage. The A.C. voltage may operate, by way of example, at one of the frequencies commonly used for the transmission of A.C. power, such as 50 or 60 Hertz, and may contain harmonics of these fequencies. The comparator 14, which may also be constructed in the form of an operational amplifier, includes terminals 58 and 60 connected respectively to the terminals 50 and 52 of the power supply 54 to receive electric power for operation of the comparator 14.

The switch 18 is a three-position selector switch electronically actuated by a signal on line 62 from the timing unit 26. In the center position, as shown, a movable contact 64 connects the input signal source 22 to the input terminal of the integrator 12 at line 20. The input signal at line 20 is applied via an input resistor 66 to the inverting input terminal 44 of the amplifier 40. There are two other positions for the switch contact 64, namely, the terminal of a calibration reference voltage source 68 and a ground terminal 70. The switch 18 has been portrayed as a mechanical switch for simplicity of description; however, it is to be understood that in a preferred embodiment of the invention, the switch 18 is to be fabricated as an electronic switch.

In operation, the converter 10 receives an input signal sample upon a switching of the switch contact 64 from the ground terminal 70 to the input signal at terminal 38. At the conclusion of a signal sampling interval, the contact 64 returns to the ground terminal 70. During the sampling interval, the signal sample is applied via the resistor 66 to the amplifier 40 with the result that the signal sample is integrated by the capacitor 42 to provide an integrated form of the signal sample at line 16. At the conclusion of the input signal sample, upon return of the switch contact 64 to the ground terminal 70, the ground voltage is treated by the integrator 12 as a further input signal which is integrated. This results in a reduction of the charge stored in the capacitor 42, a discharge of the capacitor 42 which occurs at a substantially linear rate. Thus, in response to a succession of signal samples provided by the switch 18, the output voltage of the integrator 12 on line 16 rises and falls periodically for the case of a constant voltage at the input signal. This is depicted in the third trace of the graph of FIG. 3. The time required to discharge the capacitor 42 to reduce the output integrator voltage to a value equal to the reference voltage of the comparator 14 is directly proportional to the amplitude of the input signal of the source 22. It is noted that all sampling intervals are of equal length to ensure the proportional relationship of stored charge in the capacitor 42 to input signal amplitude.

In view of the fact that the foregoing discharge time of the capacitor 42 is directly proportional to input signal amplitude, an accurate measurement of input signal amplitude is made by measuring the time required to discharge the capacitor 42 a sufficient amount to bring the integrator output voltage to a level equal to that of the comparator reference signal. By way of example, the inverting input terminal of the comparator 14 is connected to ground to serve as a reference input voltage; however, the inverting input terminal could be connected to some other magnitude of reference voltage if desired. Similarly, the connection of the non-inverting input terminal of the amplifier 40 to ground could, if desired, be altered to provide for connection to some other magnitude of voltage reference.

In accordance with the invention, a counter 72 in the timing unit 26 counts clock pulses for the duration of the foregoing discharge time of the capacitor 42. In view of the fact that the discharge of the capacitor 42 occurs at a substantially linear rate in the manner of a negative integration, the foregoing discharge interval is identified in FIG. 3 as the reference integration, while the integration of the signal sample is identified as the signal integration in FIG. 3. An output count of the counter 72 on line 74 is proportional to the input signal at terminal 38 and, therefore, serves as a measure of the input signal at terminal 38. Clock pulses from a clock 76 (FIG. 2) are applied via a logic unit 78 to the counter 72. The logic unit 78 is responsive to a timing signal of the microprocessor 28 for initiating a counting by the counter 72, and is responsive furthermore to an output signal of the comparator 14 provided upon the attainment of an equality between the output voltage of the integrator 12 and the comparator reference voltage. In response to a strobing of the logic unit 78 by the comparator 14, the logic unit 78 terminates the flow of clock pulses to the counter 72 so that the count of the counter 72 is a correct measure of the reference integration time and of the input signal voltage of the source 22.

Figure 2:
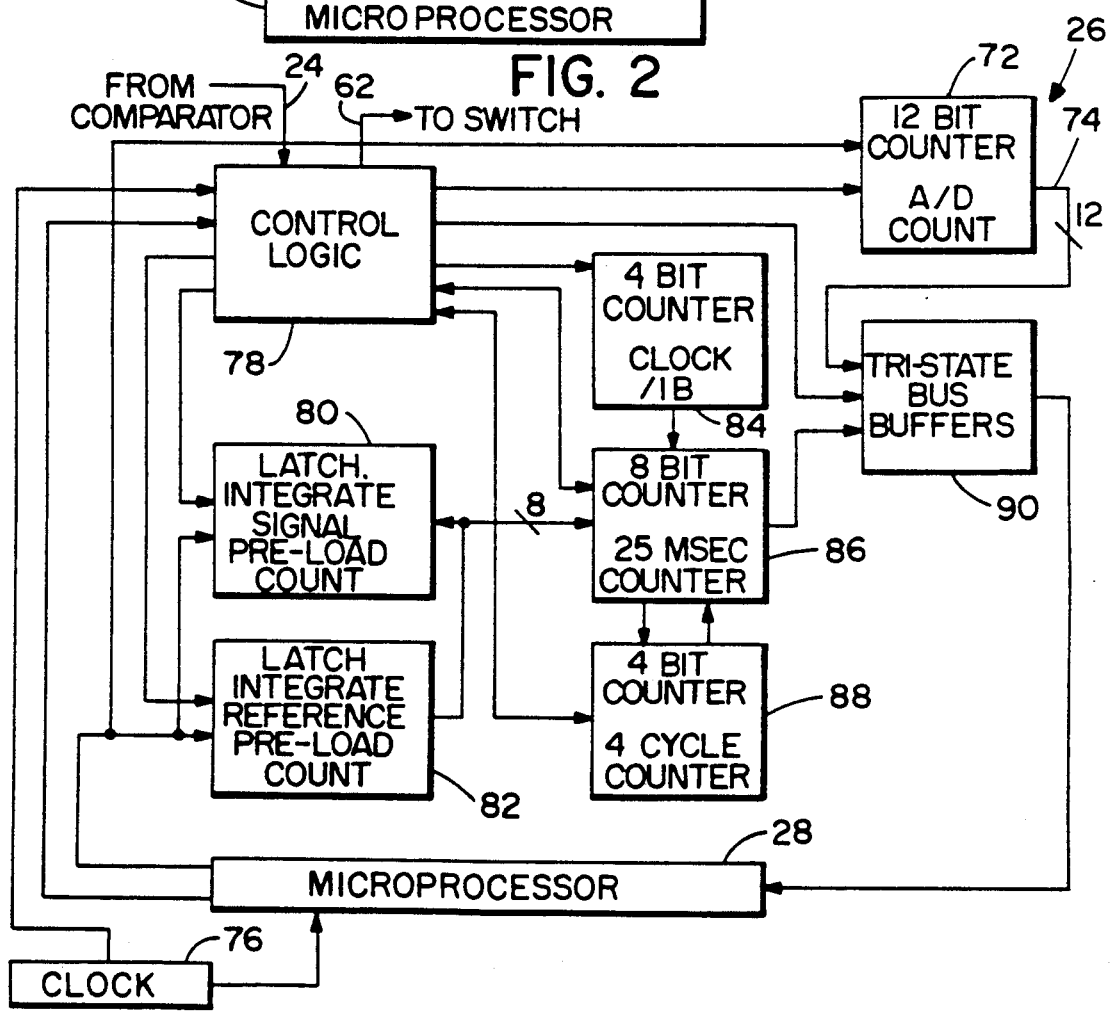
FIG. 2 is a diagram of the system timing of FIG. 1.

With reference to FIG. 2, the system timing unit 26 further comprises two latches 80 and 82, three counters 84, 86 and 88, and an output bus driver 90. In operation, the microprocessor 28 down loads into the latch 80 the duration of the signal sampling interval which, by way of example, is shown as 8 milliseconds (ms). in the third trace of FIG. 3. In the example depicted in FIG. 3, the remaining time until initiation of the next sampling is 17 ms to give a total duration of 25 ms to the composite sampling interval. The composite sampling interval is equal to the sum of the sampling time, the maximum amount of time allowed for the reference integration, and time for resetting the integrator 12 by allowing the input terminal of the integrator 12 to remain at zero volts. In the example of FIG. 3, the maximum allowable time for the sum of the reference integration and zero integration (reset) intervals is 17 ms. If desired, the signal integration time can be increased to 8.33 ms, this being the length of ½-cycle of 60 Hertz excitation, in which case the maximum allowable time for the reference integration and zero integration would be 16.67 ms. The maximum allowable time for the reference integration is loaded by the microprocessor 28 into the latch 82.

The counter 86 counts the duration of time elapsing during each of the foregoing intervals, namely the signal integration time, the maximum allowable reference integration time along with the reset interval time. To accomplish the timing of the signal integration, the integration time is down loaded from the latch 80 into the counter 86 which then counts down to zero, whereupon the counter 86 outputs a pulse signal to designate the end of the signal integration interval. The counter 86 operates by counting clock pulses applied by the clock 76 via the logic unit 78, the clock pulses being divided by 16 at counter 84, to the counter 86.

The maximum allowable duration of the reference integration interval is established by down loading the length of the interval from the latch 82 to the counter 86. The counter 86 then counts down to zero whereupon comparator 14 changes state, and reset is initiated for the remainder of the interval.

Upon inspection of FIG. 3, it is noted that there is a succession of four integration cycles depicted in the third trace. This provides for establishing a sequence of four measurements of the output voltage of the source 22, and an averaging of the four measurements. In order to accomplish the sequence of four measurements, the counter 88 is employed to count the successive occurrences of the sequence of four measurement intervals and the corresponding four integration cycles. The four cycles are presented by way of example. If desired, integration can be accomplished over a sequence of eight measurement cycles, in which case the counter 88 is employed to count the eight cycles.

The logic unit 78 is responsive to counts of the counter 88 to cycle through the sequence of four integration cycles. The logic unit first down loads the signal integrate time to the counter 86. At the conclusion of the signal integration interval, the counter 86 signals the logic unit 88 to down load the reference integration time into the counter 86. At the conclusion of the maximum allowable reference integration time, and when the comparator 14 changes state, the reset interval is imposed. Thereupon, the count of the counter 88 is incremented to indicate completion of one of the integration cycles depicted in the third trace of FIG. 3. Also, at the beginning of the signal integration interval, the logic unit 78 places the switch contact 64 to the output terminal 38 of the source 22 and, subsequently, at the inception of the reference integration interval, places the switch contact 64 at the ground terminal 70 as has been described hereinabove. Also, as has been noted hereinabove, the logic unit 78 activates the counter 72 at the beginning of the reference integration interval to measure the discharge time.

Output values of the digital signals provided by the counter 86, the logic unit 78, and the counter 72, are coupled via tri-state bus buffers of the driver 90 to the microprocessor 28 for the logging in of data. A convenience in the averaging of the signal amplitudes obtained during the sequence of four measurement intervals is obtained by use of the counter 72 in the following manner. Upon the completion of the counting of the capacitor discharge time during the first of the four integration cycles, the count in the counter 72 is retained. Thereupon, during the next integration cycle, the next measurement count is added to the previously stored count. This procedure continues throughout the sequence of the four integration cycles to provide a total count at the conclusion of the four integration cycles. This count is proportional to the average value of four measurements of the input signal voltage obtained during the sequence of four measurements. In response to a signal outputted by the counter 88, which signal designates the completion of the sequence of four measurements, the logic unit 78 directs the outputting of the count from the counter 72 to the microprocessor 28, this being following by a resetting of the counter 72 to zero. Alternately, counter 72 may be preloaded from the microprocessor 28 where the preload represents a system offset correction.

The theory of operation of the invention is explained with reference to the three traces of FIG. 3. The upper trace shows the waveform of a 50 Hertz alternating current reduced by the A.C. source 56 (FIG. 1). The second trace shows the waveform of a 60 Hertz alternating current which may be produced, alternatively, by the A.C. source 56. The two waveforms are commensurate over a common interval of 100 ms, indicated on the time axis at the top of FIG. 3. During this common interval of time, there is produced an integral number of cycles of the 50 Hertz waveform and an integral number of cycles of the 60 Hertz waveform. There are five full cycles of the 50 Hertz waveform and six full cycles of the 60 Hertz waveform during this common measurement interval. Therefore, any sequence of measurements which is accomplished during this common measurement interval of 100 ms can be repeated during a subsequent interval of 100 ms. This common measurement interval is the basic interval during which measurements are made by the converter 10 of the invention, this interval being equal to the length of time of the four integration cycles depicted in the third trace of FIG. 3.

It is a purpose of the invention to cancel the effect of any remaining A.C. ripple on the D.C. voltage provided by the supply 54 (FIG. 1). The effect of the ripple voltage may be noted in the measurement of the input signal voltage because the output voltage of the supply 54 is applied to terminals of the amplifier 40 and the comparator 14. It is presumed that any deviation from the correct measurement will have a sense depending on the polarity of the ripple voltage. Thus, by way of example, if a positive polarity of ripple, present during a measurement interval, were to produce an erroneous increase in the measurement, then a negative voltage of the ripple, present during a subsequent measurement interval, would produce an erroneous decrease in the measurement. By averaging over an even number of the positive and the negative deviations, these deviations cancel.

Upon inspection of FIG. 3, it is noted that shaded regions in the two upper traces correspond to the signal integration intervals of the third trace. The shaded region are drawn in temporal registration with the signal integration intervals. With respect to the A.C. waveform of the first trace, it may be observed by inspection that an averaging of the four shaded regions produces a net value of zero. Similarly, with respect to the A.C. waveform of the second trace, an averaging of the four shaded regions, two of which are positive and two of which are negative, produces a net value of zero. Therefore, it is concluded that deviations in the measurement of the input signal voltage are essentially compensated or cancelled by the foregoing timing of the measurements and the averaging of the measurements. This cancellation applies also to harmonics of 50 and 60 Hertz.

With respect to the selection of the common measurement interval equal to five cycles of the 50 Hertz waveform and six cycles of the 60 Hertz waveform, it is noted that the shaded regions of the 60 Hertz waveform begin at zero-crossings of every third half-cycle of the waveform. In the case of the 50 Hertz waveform, the first shaded region begins at the zero crossing, the second shaded region begins at one quarter cycle beyond the zero crossing, the third shaded region begins at the zero crossing but extending in the negative direction, and the fourth shaded region begins one quarter cycle after a zero crossing, also in the negative direction. This relationship arises because of the fact that the signal integration intervals are synchronized to begin at zero crossings of the 60 Hertz, or highest frequency, waveform, and because of the use of the common measurement interval of the integral number of cycles of the two A.C. waveforms. It is noted also that the signal integration interval may be equal to, less than, or somewhat larger than one half cycle of the higher frequency waveform and still produce the foregoing cancellation effect. Of course, if the signal integration interval is excessively long, little time remains for measuring the length of the capacitor discharge time. Also, it is noted that the integration cycles of the third trace need not be synchronized with the 60 Hertz wave form, but must have the same periodicity to allow for the proper averaging.

The foregoing construction has proven to be advantageous in providing a smaller, less expensive, integrating capacitor. Also, the total conversion cycle is accomplished in 0.1 seconds.

Let it be understood that the the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. An analog-to-digital converter comprising:

an integration circuit including an integrator for integrating an input signal;

means for discharging the integrator at a predetermined rate to obtain a measure of an amplitude of the input signal, said integrating occurring during a first interval of time, said discharging occurring during a second interval of time immediately following said first interval of time, an elapsed time of said discharging having a duration which is longer than said first interval and serving as a measure of the amplitude of said input signal, a sum of said first and said second intervals being a composite interval; and wherein said integration circuit is operative in response to electric power obtained from A.C. excitation at any one of a plurality of frequencies commensurate in terms of a common measurement interval equal to an integral number of periods of the excitation at each of said plurality of frequencies, one of said excitation frequencies being 60 Hertz and a second of said excitation frequencies being 50 Hertz, said common measurement interval being equal to six periods of the 60 Hertz excitation, to five periods of the 50 Hertz excitation, and to four of said composite intervals to remove noise associated with the 50 Hertz and the 60 Hertz excitation; and said converter further comprises timing means for operating said integration circuit periodically to provide an even integral number of said composite intervals during said common measurement interval, said timing means including means for strobing said integration circuit to perform said integrating during said first interval of time in each of said composite intervals; and means for measuring the elapsed time of a discharging during each of said composite intervals, said measuring means outputting an average value of elapsed time measured during a succession of composite intervals occurring within the single common measurement interval, the average value of elapsed time being proportional to an amplitude of the input signal substantially free of interference from the A.C. excitation.

2. A converter according to claim 1 wherein said first interval of time is equal in duration to one-half cycle of the 60 Hertz excitation.

* * * * *